United States Patent [19]

Tews et al.

[11] Patent Number: 4,615,093
[45] Date of Patent: Oct. 7, 1986

[54] METHOD AND AN APPARATUS FOR THE POSITIONING OF COMPONENTS WITH REFERENCE TO A WORKPIECE

[75] Inventors: Uwe Tews, Pinneberg, Fed. Rep. of Germany; Maximilian R. Rottmann, Wetzikon, Switzerland

[73] Assignee: Zevatech AG, Bellach, Switzerland

[21] Appl. No.: 667,951

[22] Filed: Nov. 2, 1984

[30] Foreign Application Priority Data

Nov. 5, 1983 [DE] Fed. Rep. of Germany ....... 3340084
Nov. 5, 1983 [DE] Fed. Rep. of Germany ....... 3340074

[51] Int. Cl.⁴ ..................... B23Q 17/00; B23P 21/00
[52] U.S. Cl. ........................................ 29/407; 29/709
[58] Field of Search ............. 250/222.1, 237; 29/407, 29/709

[56] References Cited

U.S. PATENT DOCUMENTS

| | | | |
|---|---|---|---|
| 3,337,941 | 8/1967 | Drop | 29/203 |
| 3,487,226 | 12/1969 | Yetter et al. | 250/222.1 |
| 3,622,396 | 11/1971 | Fernandez et al. | 250/222.1 |
| 3,624,401 | 11/1971 | Stoller | 250/222.1 |
| 3,876,877 | 4/1975 | Meulensteen et al. | 250/222.1 |
| 4,092,719 | 5/1978 | Salmon | 29/712 |
| 4,144,449 | 3/1979 | Funk et al. | 250/222.1 |
| 4,151,945 | 5/1979 | Ragard et al. | 228/6 |
| 4,247,767 | 1/1981 | O'Brien et al. | 250/222.1 |
| 4,346,293 | 8/1982 | Fetzer | 250/222.1 |
| 4,383,359 | 5/1983 | Suzuki et al. | 29/712 |

FOREIGN PATENT DOCUMENTS 2834836 6/1979 Fed. Rep. of Germany .

OTHER PUBLICATIONS

"Industrial Applications of Image Analysis", Netherlands D.E. B. Publishers, 1983.
"Robot Vision and Sensory Control", Great Britain, JFS Publications Ltd., 1982.

Primary Examiner—Howard N. Goldberg
Assistant Examiner—Steven Nichols
Attorney, Agent, or Firm—Young & Tarolli

[57] ABSTRACT

The present method and apparatus provide a possibility to remove components from a magazine, from a storage bin or the like, to transport these components to a workpiece and to put these components onto the workpiece or into it precisely at a preselected position. The component which has been picked-up by and is retained by the transportation member will usually not be in a exactly preselected position with regard to the gripping means of the transportation device, but will be more or less shifted and/or tilted with regard to a theoretical, nominal positioning axis. In order to determine the actual position of the component retained by the gripping means, the component is brought to a position scanning station during its transportation from the magazine or storage bin to the workpiece. The scanning station measures and records the actual position of the component, e.g. by scanning the shape of the component by means of laser beam scanning according to the reflection or shadowing technique, calculates any deviation and generates one or more correction signals. The latter ones are further processed in order to influence the transportation path of the component transportation device, the position of the workpiece or both of them, so that the component finally may be placed onto or into the workpiece exactly at the desired position.

23 Claims, 11 Drawing Figures

U.S. Patent   Oct. 7, 1986   Sheet 1 of 8   4,615,093
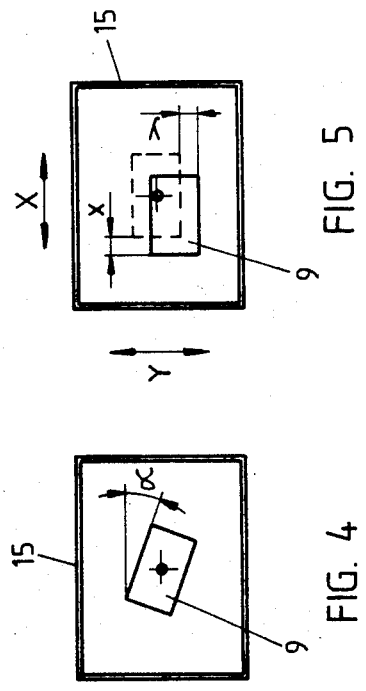
FIG. 3
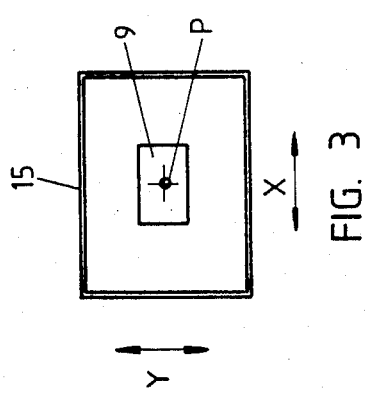
FIG. 4
FIG. 5
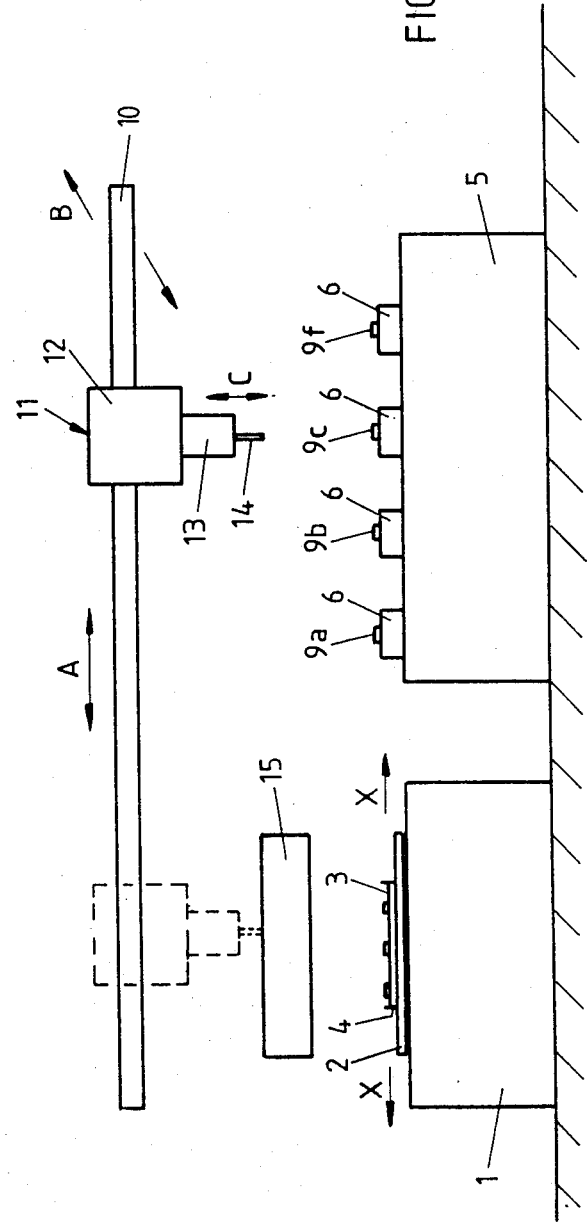
FIG. 1

METHOD AND AN APPARATUS FOR THE POSITIONING OF COMPONENTS WITH REFERENCE TO A WORKPIECE

BACKGROUND OF THE INVENTION

1. Field of the Invention

The present invention refers to a method for the positioning of components with reference to a workpiece, comprising the steps of removing the component from a magazine or a storage bin or from one certain magazine or storage bin from a group of magazines or bins, transporting the component to the workpiece and putting the component onto or into the workpiece exactly at a preselected position. The invention further refers to an apparatus suitable to perform the above mentioned method, the apparatus comprising at least one component magazine or storage bin or a magazine or storage bin group, at least a component transportation device provided with a pick-up and retaining member for the components and at least one workpiece receiving and retaining station adapted to receive a workpiece, said component transportation device being displaceable between the magazine or storage bins and the workpiece receiving station.

A preferred field of an application of the present invention may be seen in the manufacturing of electronic circuitry, particularly in the placing of electronic components on a supporting element. As supporting elements. e.g. printed circuit boards, ceramic substrates for hybrid circuitries or similar workpieces may be considered. Such supporting elements include a flat conductor carrier board consisting of epoxy resin, ceramic material or the like, the surface thereof being equipped, on the one hand, with a certain pattern of electrically conductive traces and, on the other hand, with a plurality of connecting points provided to receive discrete electrical or electronical components like e.g. resistors, capacitors, transistors etc. Particularly in view of the small dimensions and the tight arrangement found at hybrid circuitries, it is of paramount importance that the components to be placed onto the surface of the supporting element be situated with the highest possible precision at a desired position, before they are soldered to the connecting points and conductive traces provided on the surface of the supporting element.

2. Prior Art

In the interest to realize an economical manufacturing process of such electronic circuitry, automated to the highest possible degree, it is known to use automatic assembly machines, which are controlled by a suitable program and which automatically pick-up selected components from a magazine or from a certain magazine of a magazine group, transport these components to the circuit board and finally place the components on the surface of the circuit board at an exactly predetermined location. With the knowledge of the prior art available up to now it is possible to control the transportation device, which brings the component from the magazine to the workpiece, with the required high precision. On the other side, it must be mentioned that the position of the components in the magazine can not be guaranteed with the required high precision so that the position of a component picked up by the transportation device may be deviated with reference to a theoretical, nominal position axis. With other words, this means, that a component retained by the pick-up and retaining member of the transportation device may be shifted and/or tilted with regard to the desired nominal position.

In order to correct this not-presumable position deviation, one has proposed hitherto to provide the pick-up means of the transportation device with centering elements in order to shift an unexactly gripped component to the desired nominal position with reference to the theoretical positioning axis, i.e. to shift the component mechanically until the symmetry axis thereof coincides with the theoretical positioning axis of the transportation device. Such an apparatus is disclosed e.g. in U.S. Pat. No. 4,135,630, showing an arrangement for the centering of electronic components which have been removed from a magazine and which have to be placed on a circuit board. It is thereby assumed that the components to be placed on the circuit board have been eccentrically gripped and therefore can not be placed correctly, i.e. not in the required nominal position on the surface of the circuit board. In order to avoid such incorrect placing, the mentioned Patent proposes to use a centering device, with the help of which the components removed from the magazine may be exactly centered with regard to a theoretical, nominal positioning axis of the transporting device.

Basically this method and this apparatus, respectively, work satisfactory, but mechanically complicated and expensive elements are required in order to grip and mechanically shift the electronic components picked-up from the magazine, which usually have quite small dimensions, in an attempt to bring them into the theoretically required nominal position. The design and manufacturing of such a centering device, which must be made to meet very high precision standards, is therfore very delicate and expensive.

Furthermore, attention must be paid to the fact that one has to consider a remarkable wear which impairs the working precision of the centering device, and further, that under certain circumstances a destruction or damage of the components may occur. A further disadvantage of the known arrangement lies in the fact that the mass to be accelerated and deaccelerated is quite high; in the interest of a short cadence in placing a plurality of components onto a circuit board, the driving means for the transportation device, which also has to include the mentioned centering device, must be made very powerful.

Finally, it is a disadvantage of the known arrangement that usually a plurality of differently sized centering devices must be available which can be removably connected to the pick-up member on the transportation device in order to center components of different sizes. Besides the undersired timeconsuming job of changing such centering device, the comparatively high expenditure and investment for the stock of different centering devices must also be considered.

OBJECTS OF THE INVENTION

It is therefore a first, basic object of the invention to provide a method for the positioning of components with reference to a workpiece which does not exhibit the disadvantages mentioned hereinbefore and which, particularly, enables a user of the method to place components picked-up from a magazine or a storage bin onto or into a workpiece at a preselected position. A further object of the invention is to execute such positioning with a high speed and with high precision.

It is a still further, primary object of the invention to provide a method for the positioning of electric or electronic components with reference to a printed circuit board or with reference to a circuit substrate, e.g. of ceramic material as used in the manufacturing of hybrid circuits.

A still further, primary object of the invention is to provide a method for the positioning of components with reference to a workpiece which method does not require the use of a complicated, heavy and expensive centering device, but nevertheless guarantees a quick, precise positioning of the components on or in the workpiece.

A second, basic object of the invention is to provide an apparatus for the positioning of components with reference to a workpiece and which is suitable to perform the method as hereinbefore mentioned and further to be described. Such apparatus shall be able to quickly and precisely place a component at a preselected position onto a workpiece or into a workpiece.

A further object of the invention is to provide an apparatus of the kind as hereinbefore mentioned and further to be described, which does not exhibit the disadvantages of the apparatus of the prior art.

A still further object of the invention is to provide an apparatus of the mentioned kind which makes possible to supply components, particularly electric or electronic components removed from a magazine or storage bin to a workpiece, particularly to a printed circuit board or to a hybrid circuit substrate, very quickly and precisely.

A still further object of the invention is to provide an apparatus of the kind as mentioned hereinbefore which does not require nor does comprise a complicated, heavy and expensive centering device.

A still further object of the invention is to provide an apparatus of the kind as mentioned hereinbefore which is suitable for all component sizes, thereby removing the need to exchange a handling or centering device by an operator whenever components of different sizes are to be handled.

A final object of the invention is to provide an apparatus of the kind as mentioned hereinbefore which guarantees that the components handled by the apparatus are not damaged in any way and which offers the original, basic accuracy throughout its use for an extended period of time.

SUMMARY OF THE INVENTION

In order to meet the first, basic object of the invention, there is proposed a method for the positioning of components with reference to a workpiece, whereby the required component is removed from a magazine or storage bin or from the magazine or storage bin selected from a group of magazines or storage bins. Then the actual position of the component removed from the magazine or storage bin is scanned and the component is transported to the region of a workpiece by means of a component transporting means. Now, as the component has to be put onto the workpiece in a preselected position, the component transporting means is displaced to a relative, preset nominal position with reference to the workpiece after the component has been removed from the magazine or storage bin. In this nominal position a selectable positioning axis of the component transporting means concides with the preset nominal position of the component on the workpiece. Thereafter, in the course of the transportation of the component towards the workpiece, the actual position of the component with reference to the positioning axis is measured and a possible occurring difference to the preset nominal position is recorded.

For a further proceeding of the method, up to a completion thereof, there are three different ways, which are to be choosen according to the individual field of application.

The first way according to the invention involves the additional step of changing the transportation path of the component transportation means, if required, depending of the measured and recorded difference value between the nominal position and the actual position, before the component is put onto the workpiece.

The second way according to the invention involves the additional step of changing the position of the workpiece, if required, depending of the measured and recorded difference value between the nominal position and the actual position, before the component is put onto the workpiece.

The third way according to the invention involves the additional step of changing both the position of the workpiece and the transportation path of the component transporting means, if required, depending of the measured and recorded difference values between the nominal positions and the actual positions, before the component is put onto the workpiece.

According to the method according to the invention, it is understood that it is waived from rearranging the component once picked-up to a desired, theoretically perfect position, i.e. to bring its center into coincidence with the theoretical positioning axis through the gripping means of the transportation device. In contrary, the value of any eccentricity of the component with reference to the positioning axis and, if required, also any tilting is determined, and consecutively the transportation path of the component and/or the position of the workpiece is changed or corrected in such a way that the component finally may be positioned on the or in the workpiece at the preselected position with very high accuracy. Due to the fact that no centering device is necessary any longer, the moved mass of the apparatus may be kept much smaller. The correction operation, either of the transportation path of the component or of the position of the workpiece, may be performed by the control device of the apparatus, which is anyhow required, so that no additional equipment will be necessary.

Preferably the scanning of the position of the component is performed without putting it down, but during the component being retained by the component transporting means. The component, having been removed from a magazine or storage bin and having been brought to a position scanning device, in which its actual position is determined, will be placed on or in the workpiece. The scanning device records the deviation of the component with reference to a theoretical positioning axis and produces a correction signal. As already mentioned, there are three ways to make use of such a correction signal:

Correction of the transporting path of the component;

Correction of the position of the workpiece;

Correction of the transporting path of the component and correction of the position of the workpiece.

In the most simple case it may be sufficient to determine the position, i.e. a possible deviation from the nominal position, in one single, horizontally extending direction. This is the case if the components to be picked-up from the magazine are accurately positioned in a first horizontal coordinate, but less accurately in a second horizontal coordinate which is rectangular to said first coordinate. Usually it will be necessary to determine the deviation of the position of the component picked-up from the magazine from the nominal position in two rectangular directions, i.e. in a X-coordinate and in a Y-coordinate. Such scanning may be performed in a scanning device which will be further described hereinafter.

In some cases it may be desirable to determine not only a deviation of the component in X- and in Y-direction, but also with regard to a possibly occuring tilting deviation. This can also be performed in the mentioned scanning device, which will be explained in detail hereinafter. In such cases the scanning device will produce a fault signal which is related to the tilting angle; from the fault signal will be derived a correction signal to be fed to a rotation device operatively connected to the pick-up means of the transporting device to correct the position of the component with regard to its tilting angle.

In any case, the scanning device is in a position to deliver one or a plurality of correction signal or signals which are used to correctly place the component onto or into the workpiece. As already mentioned, it is possible at will, using this correction signal or these correction signals, either to influence the transportation path of the transporting apparatus or the position of the workpiece or both simultaneously, the latter in the sense of an optimization to the movements of the apparatus.

Finally it should be mentioned that the position of the component in a Z-coordinate may be determined in a similar manner. The scanning device may read the actual position of the component with regard to its height and produce a further correction signal, if necessary, to ensure a perfectly smooth placing of a component on the surface of a workpiece.

In order to meet the second, basic object of the invention, there is proposed an apparatus for the positioning of components on a workpiece. This apparatus comprises a workpiece receiving and retaining means adapted to receive and retain a workpiece which has to be provided with one or a plurality of components to be placed onto or into the workpiece at one or at a plurality of preselectable nominal positions. Further there is provided a magazine or storage bin or a group of magazines or a group of storage bins, each magazine and storage bin, respectively, containing a plurality of components to be placed onto said workpiece or inserted into said workpiece. A component transportation means displaceable between said magazine and storage bin, respectively, or each of said magazines and storage bins, respectively, of said group, is adapted to bring the components to the workpiece. It comprises a pick-up and retaining member adapted to pick-up and remove a selected component from one selected magazine or storage bin and to retain it during transportation thereof to the workpiece. Position scanning means serve for measuring and determining the actual position of a component to be transported to the workpiece, said position scanning means being arranged within the path of displacement of the component retained by the pick-up and retaining member of the component transporting means. It measures any relative position deviation of the component with reference to a nominal position related to a positioning axis of the pick-up and retaining member. Finally, a control means operatively connected to the position scanning means and further at least to the driving unit of said component transportation means is provided and adapted to influence the driving unit upon consideration of the values of the relative position deviation measured by the position scanning means.

As already mentioned in connection with the method according to the invention, it is also with regard to the apparatus ensured that it is waived from rearranging the component once picked-up to a desired, theoretically perfect position, i.e. to bring its center into coincidence with the theoretical position axis through the gripping means of the transportation device. In contrary, the value of any eccentricity of the component with reference to said position axis and, if required, also any tilting is determined, and consecutively the transportation path of the component and/or the position of the workpiece is changed or corrected in such a way that the component finally may be positioned on the or in the workpiece at the preselected position with very high accuracy. Due to the fact that no centering device is necessary any longer, the moved mass of the apparatus may be kept much smaller. The correction operation, either of the transportation path of the component or of the position of the workpiece, may be performed by the control device of the apparatus, which is in anyhow required, so that no additional control equipment will be necessary.

Preferably the position scanning means is arranged in a certain distance above the workpiece receiving and retaining means and is positioned essentially concentrically thereto. It is thereby possible to stop the component transportation means for a short time above the workpiece, preferably when the component gripped by the transportation means is in the range of the position scanning means. During this short stop the actual position of the component with reference to the theoretical positioning axis, i.e. with reference to its nominal position, is determined and a correction signal or a number of correction signals are derived, which represent a deviation of the position of the component in X and Y-direction and, if necessary, also regarding any tilt thereof. As the scanning device is operatively connected to the control means of the apparatus, which thereby receives these correction signals, either the further transportation path of the component gripped by the transportation device or the position of the workpiece may be changed, or both of these measures can be taken.

Another possibility may be seen in an arrangement, where the position scanning means is arranged on the component transportation means, below the component pick-up and retaining member, and being positioned essentially concentrically thereto. Such an arrangement provides for a determining of the possibly occurring deviation of the position of the component during its transportation without the need of interrupting the movement of the component transportation means. As far as the derivation and development of the correction signals is concerned, the facts mentioned just hereinbefore are true as well.

Of course there are a number of possibilities to practically realize the apparatus of the invention. In a preferred embodiment, the position scanning means comprises a frame member, whereby the pick-up and retaining member of the component transporting means, while bearing a component to be placed onto or into the workpiece, is adapted to pass through the interior of the frame member. As already mentioned, it may be necessary to stop the motion of the transportation means for a short while, when the component is in the interior of the frame member. In this instance, i.e. while the component passes through the frame member, its actual position is scanned, any deviation from the nominal position is determined and one or more correction signals are derived from this measurement.

The frame member may have essentially square or rectangular shape and includes four frame side elements, at least one of the frame side elements being equipped with position scanning members. The scanning may thereby executed either by contacting the component or without touching it. In the first case, at least some of the four frame side elements are equipped with a position scanning needle, which is arranged essentially in the center of the frame side element, which extends essentially perpendicularly thereto and which is longitudinally displacably received on the frame side element. Each of the position scanning needles is operatively connected to a driving and measuring unit provided on the frame side element and is adapted to displace the needle towards the center of the frame member and to measure the degree of such displacement. As soon as the tips of the needles contact the side face of the component, the displacement of the needles is determined and one or more correction signals are derived which reflect the actual position of the component and influence the control means as hereinbefore explained.

In the second case, a scanning without touching the component may be performed e.g. by means of a laser beam or by means of a plurality of laser beams. Also in this case, there exist a number of different possibilities, which will be further explained in full detail hereinafter. It should only be mentioned right here that a scanning without touching the component may offer general and basic advantages (as, e.g. lack of any wear of the measuring means), and furthermore, that thereby also the scanning of a tilted position of the component around a positioning axis is possible, besides the measurement of a deviation from the nominal position in the X- and Y-directions. Finally it is also possible to determine the actual position of the component with regard to its height.

BRIEF DESCRIPTION OF THE DRAWINGS

In the following, there will be described several embodiments of the apparatus according to the invention as well as the method, with reference to the accompanying drawings, in which:

FIG. 1 shows a general, schematic overall side view of an apparatus according to the invention.

DETAILED DESCRIPTION OF PREFERRED EMBODIMENTS

As can be seen from FIG. 1 the apparatus according to the invention includes a console 1, the top surface thereof being equipped with a workpiece receiving and retaining means in the form of a working table 2. The table 2 comprises driving means (not shown) operatively connected thereto and enabling the table 2 to be displaced, on the one hand, in the direction of the arrows X and, on the other hand, in the direction of the arrows Y (see FIG. 2). Both displacement directions X and Y are rectangular to each other and extend in an essentially horizontal plane.

A workpiece 3 is arranged on the working table 2 and is immovably retained thereon. In the present example the workpiece 3 may be a printed circuit board or a substrate, e.g. of ceramic material, intended for the manufacturing of an electronic circuitry. The working table 2 is equipped with positioning and retaining means 4 engaging the workpiece 3 arranged on the table 2 and adapted to fix the workpiece 3 immovably on the working table 2.

Figure 2:
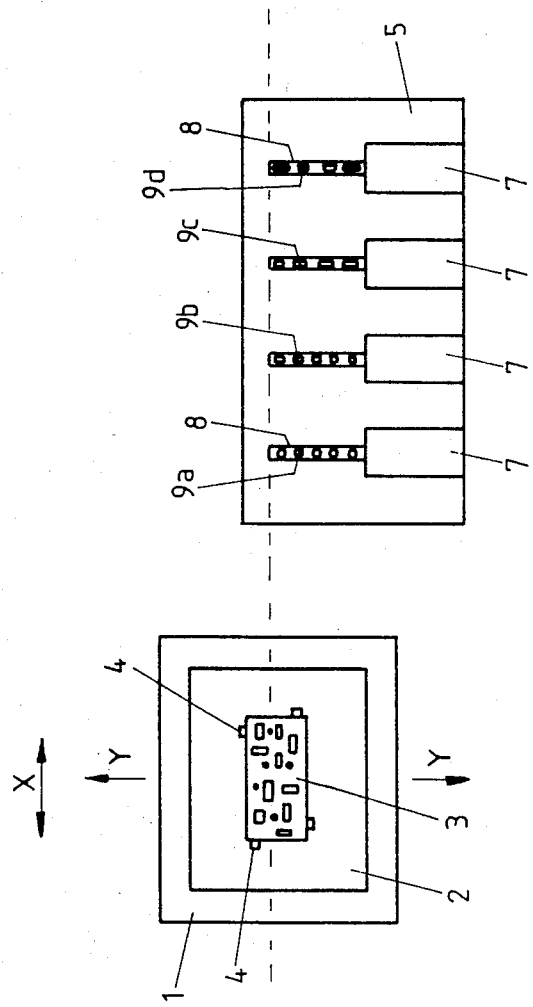
FIG. 2 shows a top view of the workpiece receiving and retaining station as well as of a magazine group, this arrangement corresponding to the one of FIG. 1, FIGS. 3-5 show schematic views of the position of a component within the scanning device.

A further console 5, being also part of the apparatus according to FIGS. 1 and 2, is provided in a certain distance from the already mentioned console 1 and bears a number of component magazines 6. The latter ones include a stock member, from which a tape 8 extends, which is provided with a plurality of components 9a, 9b ..., which are e.g. glued to the upper surface of the tape 8. Of course it is possible to make use of other types of component magazines 6, e.g. in the form of storage bins or the like (not shown). It is understood that there is provided a number of additional auxiliary handling means related to the operation of the magazines, which are not shown in the drawing, because they are not within the scope of the present invention. The design thereof may be chosen by any persons skilled in the art according to their needs.

As can be further seen from FIG. 1 a guiding support member 10 is arranged above the two consoles 1 and 5 which receives and guides a component transportation device 11. The latter includes a sliding carriage member 12 which is displaceable along the guiding support member 10 in the direction of the arrow A. Preferably the complete guiding support member (10) and sliding carriage member (12) arrangement may be displaceably arranged in a direction according to arrow B, perpendicular to the direction indicated by the arrow A.

The component transportation device 11 includes a pick-up and retaining member 13 which is equipped with a hollow suction needle 14 adaped to pick-up and retain a component 9a ... 9d removed from one of the component magazines 6. The hollow interior of the suction needle 14 is connected to a vacuum source (not shown). As soon as the tip of the needle 14 contacts the upper surface of a component 9 to be removed from the magazine, the vacuum is switched on with the effect that the component 9 sticks on the needle 14. In order to realize this operation, the whole arrangement of the component pick-up and retaining member 13 is adjustable with regard to its height in the direction of the arrow C. This means that the needle 14 may be lowered from a position shown in FIG. 1 down to a selected component 9 in order to pick it up and to retain it by the aforementioned suction effect. As soon as the selected component is retained on the tip of the needle the arrangement of the component pick-up and retaining member may be raised again.

As already mentioned the component transporting device 11 is displaceable along the guiding support member 10 in the direction of arrow A, namely in a first position above a position scanning device 15 (shown by dashed lines in FIG. 1). The position scanning device 15 is directly and centrally above the working table 2 and has essentially frame-like shape. This enables the component 9 retained by the needle 14 to be introduced into the interior of the position scanning device 15 and to pass theretrough, together with the needle 14.

Further details regarding the position scanning device 15 will be discussed hereinafter in connection with several embodiments shown in FIGS. 6 to 11. Anyway the position scanning device 15 is in a position to recognize the actual position of a component 9 with reference to a vertical, nominal positioning axis, to determine any deviation therefrom and to the derive one or a number of correction signals from the measured value or values.

The FIGS. 3 to 5 schematically show different positions of a component 9 lying within the framelike position scanning device 15 with reference to the vertically extending positioning axis P. While the component 9 shown in FIG. 3 is in the theoretically correct nominal position regarding the X-coordinate as well as the Y-coordinate and does not show any tilt with regard to the frame of the scanning device 15, the components shown in FIGS. 4 and 5, respectively, are in tilted and in linearly eccentric position, respectively.

The position scanning device 15 is adapted to recognize, in the case of the situation according to FIG. 4, the tilting angle of the component 9 with reference to a nominal angle, to derive therefrom a correction signal and to drive the needle 14 or the component pick-up and retaining member 13 to a rotational movement, until the component 9 occupies the position shown in FIG. 3. Furthermore the position scanning device 15 is able to recognize a lateral shift of the component 9 in the direction of arrow X as well as of arrow Y (FIG. 5) in a horizontal plane. In the situation according to FIG. 5 the component 9 is deviated from its nominal position by a distance value x in the direction of the arrow X and by distance value y in the direction of the arrow Y. These deviation values having been determined, the position scanning device 15 derives therefrom two correction signals which are fed to the control unit of the apparatus in order to initiate either a correction of the transportation path of the component transportation device 11 in the direction of the arrows A and/or B or a correction of the position of the working table 2 in X- and/or Y-direction or a combined correction.

In practice the method proceeds as follows:

The component transportation device 11 is in a position as shown in FIG. 1, i.e. above a selected magazine 6. The suction needle 14 is lowered in the direction of the arrow C until the tip thereof contacts the surface of the component 9c to be removed from the magazine 6 and to be transported to the workpiece 3. Now the vacuum source is activated and the component 9c will stick on the tip of the needle 14. Thereafter the needle 14 is retracted into a position as shown in FIG. 1. Normally a component 9c picked up in this manner will not be exactly centered on the tip of the needle 14 with regard to the central axis through the needle, but will be somewhat shifted in X- and Y-direction. In addition it might also be possible that the component 9c picked up by the needle 14 is tilted with regard to a nominal angular position.

As a next step the component transportation device 11 moves to the position shown in dashed lines in FIG. 1 above the working table 2 and the needle 14 is lowered until the component 9c enters the interior of the scanning device 15. Depending of the construction of the latter the motion of the needle 14 is stopped or proceeds; anyway the actual position of the component 9c is determined when the component 9c is in the interior of the framelike scanning device 15. A resulting correction signal from the scanning device 15 either effects a position correction of the component transportation device 11 in the direction of the arrows A and/or B, a correction of the position of the working table 2 in X- and/or Y-direction or a combination of both correction movements. Thereafter it is made sure that the component 9c sticking on the tip of the needle 14 is in a correctly centered position above the workpiece 3, so that the needle 14 may be lowered to place the component 9c with highest precision onto the surface of the workpiece 3.

As already previously mentioned the position scanning device 15 also recognizes a tilting deviation of the component 9c with reference to a nominal angular position. The correction signal derived therefrom may be used to drive the needle 14 to a rotational movement until the desired parallel position of the component 9c is achieved. With the help of the control means available today, such scanning, deriving of a correction signal and final correction can be performed in such a short time that it will not be necessary either to really stop the motion of the needle 14 with a component 9c retained thereon within the interior of the frame like position scanning device 15 or to stop it for but a very short time.

As soon as the component 9c is placed on the surface of the workpiece 3 the vacuum in the interior of the needle 14 is removed and the needle 14 is withdrawn; now the component transportation device 11 may be displaced back to the starting position shown in FIG. 1 or into a position somewhat different in the direction of arrow A above one of the magazines 6. As soon as the desired position of the needle 14 is reached it can be lowered again in order to pick-up another component 9a . . . 9d. The steps as hereinbefore explained are now repeated until all components to be placed onto the workpiece 3 are removed from the magazines 6 and put to the workpiece.

In the following description, several embodiments of the apparatus, particularly several embodiments of the position scanning device 15, will be explained in more detail, with reference to FIGS. 6 to 11.

Figure 7:
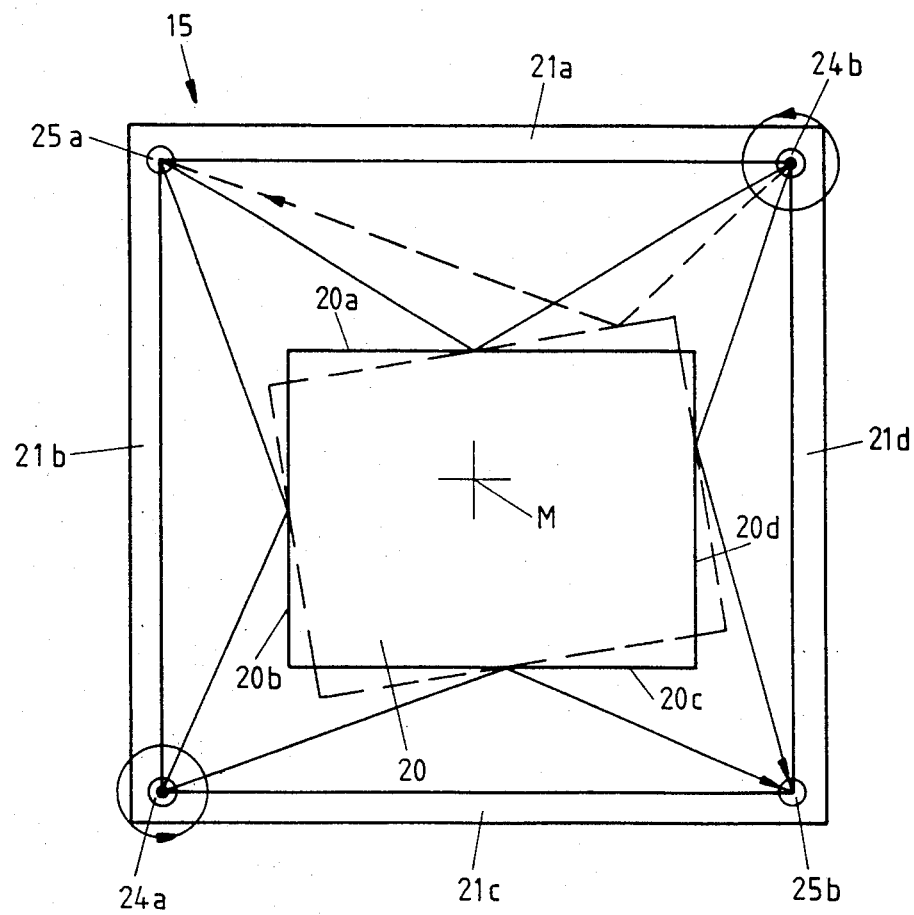
FIG. 7 shows a schematic top view of a second embodiment of a scanning device, in which the position of the component is scanned without touching it.
Figure 8:
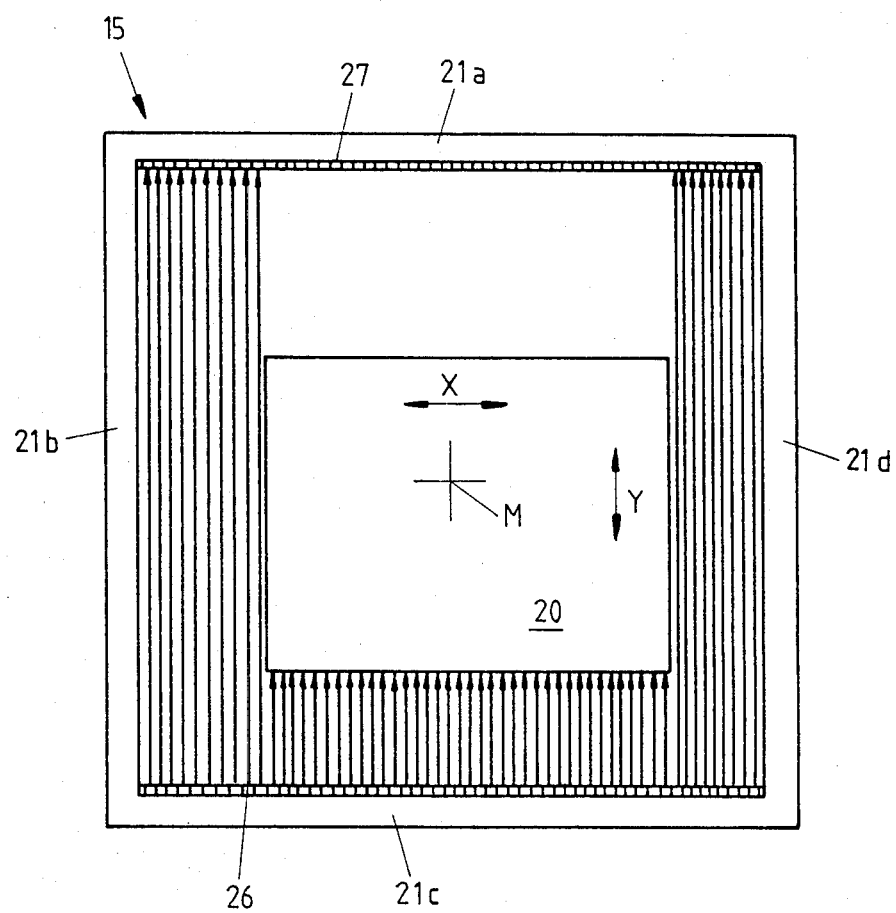
FIG. 8 shows a schematic top view of a third embodiment of a scanning device, in which the position of the component is scanned without touching it.
Figure 9:
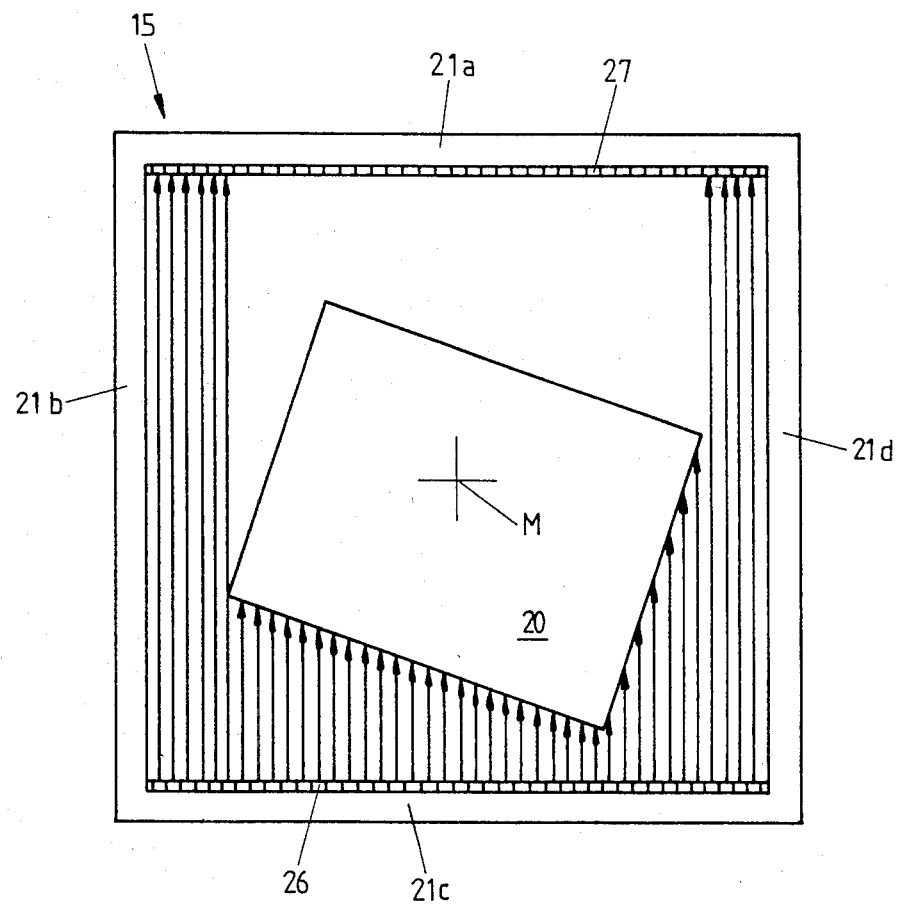
FIG. 9 shows a top view of the embodiment according to FIG. 8, but with the component in a tilted position.
Figure 10:
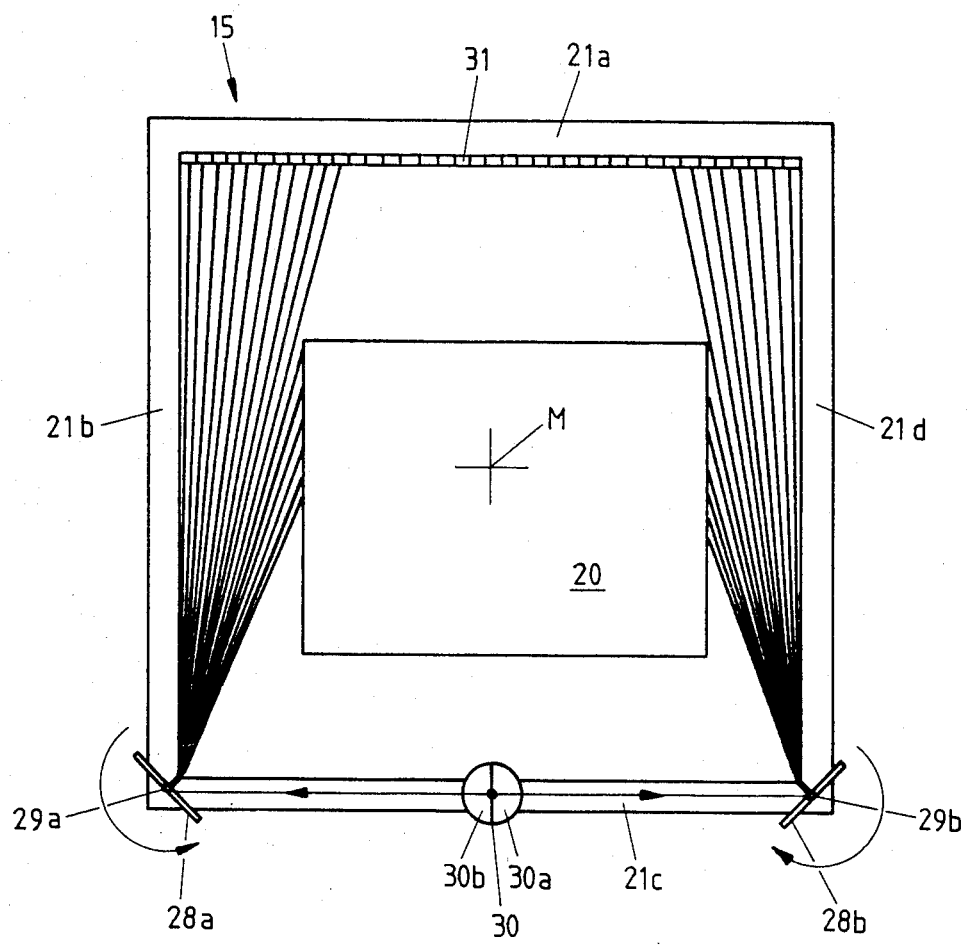
FIG. 10 shows a schematic top view of a fourth embodiment of a scanning device, in which the position of the component is scanned without touching it.
Figure 11:
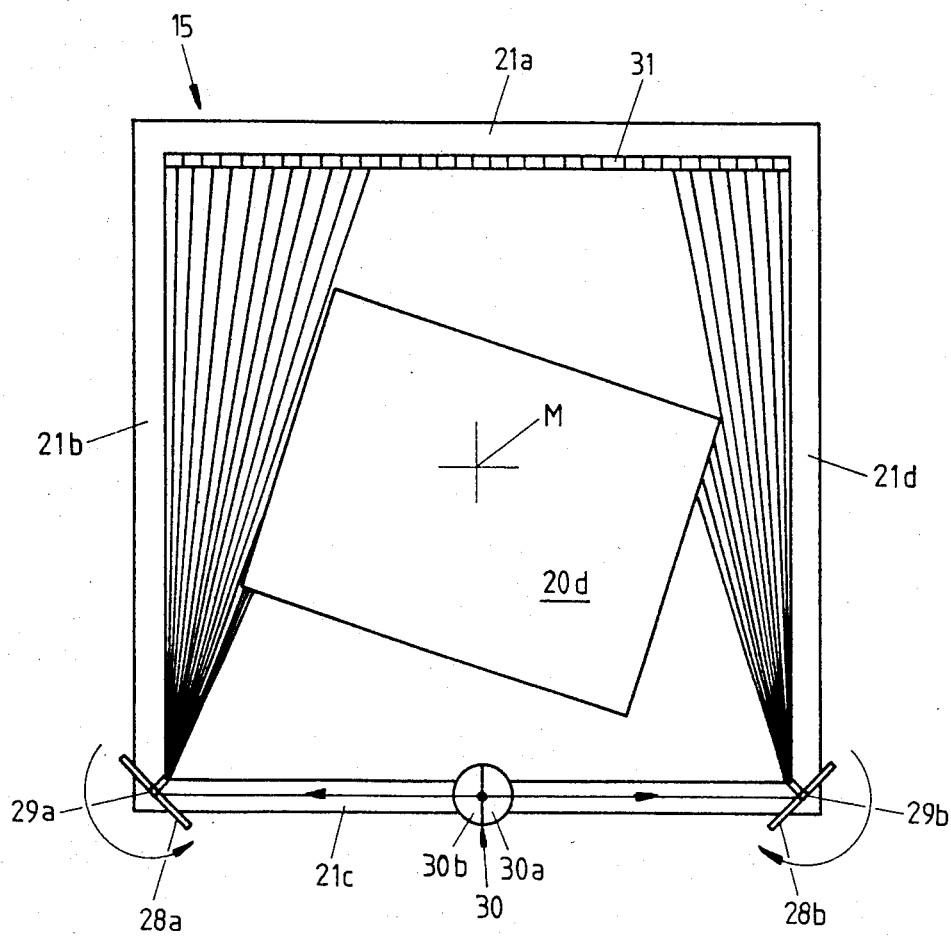
FIG. 11 shows a top view of the embodiment according to FIG. 10, but with the component in a tilted position.

The component 20 and 20d in FIGS. 9 and 11, respectively, is shown in a tilted position, while the component 20 of FIGS. 6, 7, 8 and 10 is angularly correctly positioned, but shifted in X- and Y-direction. The position scanning device 15 is able, in the case of the situation according to FIGS. 9 and 11, to determine the angle of rotation of the component 9, to derive therefrom a correction signal and to effect a rotational movement of the needle 14 or of the component pick-up and retaining member 13, until the component 9 exhibits a position parallel to the side edges of the workpiece 3 as shown in FIGS. 6, 7, 8 and 10. Further the position scanning device 15 recognizes a lateral shift of the component 9 in horizontal direction, e.g. according to FIG. 6 by a value x in X-direction and by a value y in Y-direction. Correction signals derived from the measured values indicate either a correction of the transportation path of the component transportation device 11 in the direction of the arrows A and/or B or a displacement of the working table 2 in X- and/or Y-direction or a combination of both correction movements.

Different embodiments of the position scanning device 15 are shown in FIGS. 6 to 11 and will be explained hereinafter.

Figure 6:
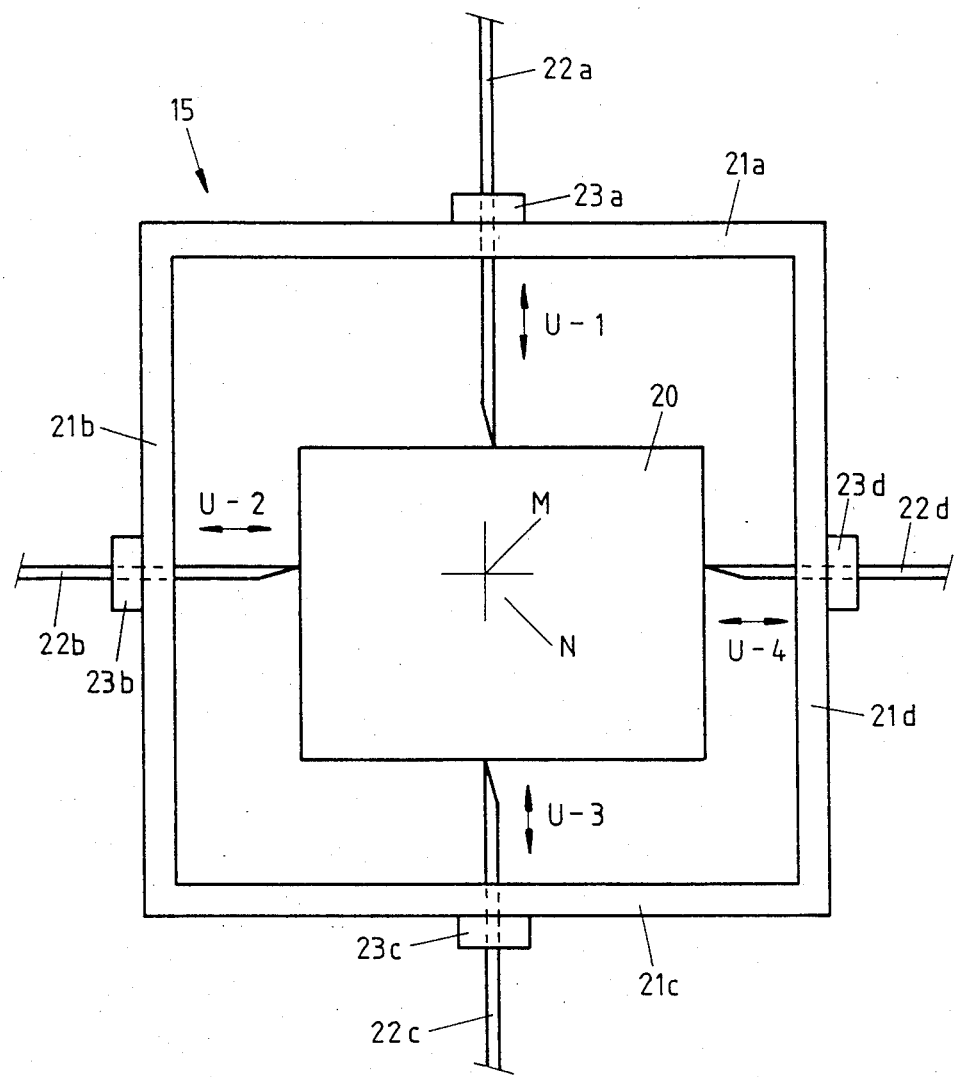
FIG. 6 shows a schematic top view of a first embodiment of a scanning device, in which the position of the component is mechanically scanned.

In FIG. 6 there is shown a mechanical solution of the position scanning device 15, in which the component 20 to be scanned is mechanically contacted to determine its position. The device 15 shown in FIG. 6 comprises a square frame member including four frame side members 21a to 21d. Each of these side members is equipped with a needle 22a to 22d which is longitudinally displaceable and operatively connected to a driving and measuring unit 23a to 23d. The latter ones drive the needles 22 in the direction of the arrows U-1 to U-4, i.e. perpendicularly to the extension of the four frame side members 21. It is well known in the art to design such driving and measuring units 23 and it seems not to be necessary to further discuss their construction. Important is that they are in a position to record the value of the longitudinal displacement of the needles 22 and to output a control signal which is fed to the central control unit of the apparatus. The function is as follows:

In a starting postion the needles 22a to 22d are in their most retracted position so that a component 20 retained by the suction needle 14 may be introduced into the interior of the frame like position scanning device 15 constituted by the four frame side members 21. The center of the needle 14, i.e. the theoretical positioning axis is designated with M. As soon as the component 20 has reached a preselected position within the position scanning device 15, the needles 21a to 21d are driven towards the component 20 under the influence of the driving and measuring units 23a to 23d, until the tips thereof contact the side faces of the component 20. The value of the displacement of the needles 22 is measured by means of the driving and measuring units 23; this value is recorded and a correction signal or a plurality of correction signals is derived therefrom. The value of this correction signal or these correction signals is directly related to the value of the deviation of the center N of the component 20 from the nominal position, namely the axis M. The correction signal or signals influence the drive of the component transportation device 11 and/or the drive of the working table 2. As soon as the actual position of the component 20 has been determined, the needles 22a to 22d are retracted and the component 20 may be put on the surface of the workpiece 3, where it will take the theoretically optimal position with utmost accuracy.

An application of the embodiment shown in FIG. 3 and described hereinbefore of the position scanning device 15 is particularly advantageous if the shape of the side faces of the component 20 are irregular or unknown. A disadvantage of this embodiment may be seen in the fact that a tilting displacement of the component 20 around the axis M may not be recognized. Therefore it must be supposed that the compoent 20 has been removed from the magazine in correct angular position and might be displaced or shifted only laterally in X- and Y-direction with reference to the nominal position defined by the axis M.

A second embodiment of the position scanning device 15 is shown in FIG. 7. Again there is provided a square frame comprising four frame side members 21a to 21d in which the needle 14 retaining the component 20 is introduced. The arrangement according to FIG. 7 comprises two laser diodes 24a and 24b which are arranged in the region of two opposite corners of the frame of the position scanning device 15 and which are driven to a rotational movement by suitable driving units (not shown). The laser diodes 24 emit a sharply focussed beam which will be reflected by the side surfaces of a component positioned in the interior of the frame constitued by the four frame side members 21. The other two opposite corners of the frame are equipped each with a receiver diode 25a and 25b which are adapted to receive the beams emitted by the two diodes 24 and reflected by the component 20.

It can be seen from FIG. 7 that the laser diode 24b will emit a beam during its rotation which firstly is reflected by the side face 20a of the component 20 in such a way that the reflected beam will reach the receiver diode 25a, whereby such receipt of the beam will be registered. During a further rotation of the laser diode 24b the situation will occur that the laser beam is reflected by the side face 20d of the component 20 and received by the receiver diode 25b. The laser diode 24b will be in a certain angular position, when one of the receiving diodes 25 notices a receipt of the laser beam reflected by the side face 20a and in a further certain angular position, when the other receiving diode 25 notices the receipt of the laser beam reflected by the side face 20d. These two angular positions are recognized and recorded by the control unit of the apparatus. The situation in connection with the laser diode 24a is corresponding: During its rotation it will take a certain angular postion in which the emitted beam is reflected by the side face 20c under such an angle that the reflected beam portion may be received by the receiving diode 25b and thereafter such an angular position in which the emitted beam is reflected by the side face 20b under such an angle that the reflected beam portion may be received by the receiving diode 25a. These two angular positions are recorded by the control unit as well.

Based on the values of these angles, it is possible according to known mathematical laws to derive one or more correction signals which are directly related to the value of the deviation of the position of the component 20 from the theoretical nominal position. It is thereby assumed that the component 20 has an angularly correct, nominal position with reference to the frame side members 21a to 21d; this situation is shown in FIG. 7 with solid lines. However it is possible that the component 20 is tilted around the axis M by a certain angle. Such a situation, as well as the path of the laser beams in such situation, is shown in FIG. 7 by dashed lines. It is understood that the angle of rotation of the laser diodes 24a and 24b will be different with reference to the situation as described just hereinbefore in the moment where the reflected beams hit the receiving diodes 25a and 25b. Consequently it is possible, by an analysation of the rotating angle in the moment of receipt of the reflected laser beams and by continuously rotating the component 20, if required in both directions, to determine the angular position of the component 20, in which it is exactly parallel to the frame side members 21 of the position scanning device 15.

A further embodiment of the position scanning device 15 is shown in FIGS. 8 and 9. Thereby the position of a component 20 is also determined without touching it with mechanical means. One frame side member, in the examples according to the drawings the side member 21c, is equipped with a row of beam emitting elements 26, e.g. with laser diodes. The beam originating from such diodes is sharply focussed and extends parallely to the frame side members 21b and 21d. The frame side member 21a which is opposite to the frame side member 21c is equipped with a correspondingly arranged row of receiving elementes 27, e.g. light sensitive semiconductor diodes or the like, in such a way that each laser diode 26 emits a beam of light to a correlated receiving diode 27.

In the situation according to FIG. 8 the component 20 is shifted, with reference to the positioning axis M, in X-direction to the right and in Y-direction downwardly, but has the correct angular position, i.e. its side faces being parallel to the frame side members 21. Consequently a certain number of receiving diodes 27 situated at the left side as well as a certain number of receiving diodes 27 situated at the right side are enabled to receive the laser beams emitted by the laser diodes 26, while a certain number of receiving diodes 27 situated in the center of the frame side member 21a are not in a position to receive the laser beams emitted by the correlated laser diodes 26, because they are in the shadow of the component 20. The ratio between the number of the left-sided receiving diodes 27 receiving a laser beam and the right-sided receiving diodes 27 receiving a laser beam is thereby useable as a coefficient which is directly proportional to the deviation of the component 20 in X-direction with reference to the nominal position. In order to determine the eccentricity in Y-direction the component 20 is rotated by exactly 90° whereby such deviation is measured correspondingly as hereinbefore explained. The two measured values are fed to the control unit of the apparatus and one or several correction signals are derived therefrom, which influence the transportation path of the component transportation device 11 and/or the position of the workpiece receiving and retaining means 2.

If a situation occurs as it is shown in FIG. 9, i.e. if the component 20 is tilted around the axis M, a smaller numer of left-sided and right-sided receiving diodes 27 can receive a beam emitted by the laser diodes 26. Consequently the component 20 is rotated around its axis M until the number of the diodes 27 receiving a laser beam is maximized. Thereby it is ensured that the component 20 is in the desired position, i.e. its side faces being parallel to the frame side members 21.

A further embodiment of the position scanning device 15, operating without touching the component as well, is shown in FIGS. 10 and 11. Essentially this embodiment is a combination of the embodiment according to FIG. 7 on the one side and of the embodiment according to FIGS. 8 and 9 on the other side. Again there is provided a frame like scanning device 15 essentially constituted by the four frame side member 21a to 21d. Similarly to the embodiment according to FIGS. 8 and 9, one frame side member, namely 21a, is equipped with a row of receiving diodes 31. The frame side member 21c opposite to the frame side member 21a comprises an immovably arranged light source 30 in the form of a doublesided laser diode, the two halves 30a and 30b thereof emitting a sharply focussed beam into two diametrally opposite directions. These beams extend essentially parallel to the frame side member 21c. In the region of the two ends of the frame side member 21c there are provided two reflection elements 28a and 28b, e.g. in the form of mirrors, which are rotatably supported around rotational axis' 29a and 29b. The beams emitted by the two halves 30a and 30b of the laser diode 30 hit the surface of the mirrors 28a and 28b and are reflected towards the interior of the position scanning device 15, where the component 20 is.

Depending of the position of the component 20, regardless whether with reference to a tilt around the axis M as shown in FIG. 11 or with reference to a lateral displacement in X- and/or Y-direction as shown in FIG. 10, more or less of the receiving diodes 31 are hit by the beams emitted by the laser diode halves 30a and 30b and reflected by the rotating mirrors 28a and 28b. A possible proceeding to measure and determine the position of the component 20 may be as follows: The component 20, which is supposed to be in a position according to FIG. 11, is rotated around the axis M until its correct angular position is recognized. Thereafter a possible deviation in X-direction is determined on the basis of the number of the left-sided and right-sided receiving diodes 31 which are hit by the two laser beams emitted by the laser diode halves 30a and 30b and reflected by the mirrors 28a and 29a. A correction signal, representative of a X-deviation, is derived from the measured value. Now the component 20 is rotated by exactly 90° in a corresponding manner and a correction signal for the Y-deviation is gained. These two correction signals are fed to the control unit of the apparatus, as previously explained, and the transportation path of the component transportation device 11 and/or the position of the working table 2 are corrected accordingly.

It is understood that the apparatus as hereinbefore described may be varied in numerous ways within the scope of the present invention. Of course the same is true for the method of the invention. Particularly it may be desirable to use the method and the apparatus according to the invention not for the positioning of electronic components on a circuit board, but in connection with any other assembling process requiring an automated, exact positioning of components of any kind on or in a workpiece, e.g. in the field of watchmaking or the like.

What we claim is:
1. A method of positioning a component in a preset position on a workpiece, said method comprising the steps of:
   removing the component from a storage;
   transporting the component from the storage into the region of the workpiece by component transporting means, said component transporting means having a positioning axis, and the component having a predetermined nominal position relative to the positioning axis;
   moving the component transporting means to position said positioning axis in a predetermined position relative to the workpiece;
   detecting the actual position of the component relative to the positioning axis of said component transporting means and measuring the deviation of said actual position of the component from the predetermined nominal position thereof relative to the positioning axis while the component is spaced from the workpiece;

generating a control signal in response to a deviation of the actual position of the component from the predetermined nominal position thereof relative to the positioning axis;

changing the position of the positioning axis of the component transporting means with respect to the workpiece in response to the control signal to thereby change the actual position of the component so that it coincides with the preset position thereof on the workpiece, and thereafter positioning the component on the workpiece.

2. A method according to claim 1 wherein changing the position of the positioning axis of said component transporting means is effected by displacing said component transporting means.

3. A method according to claim 1 wherein changing the position of the positioning axis of said component transporting means is effected by displacing the workpiece.

4. A method according to claim 1 wherein changing the position of the positioning axis of said component transporting means is effected by displacing said component transporting means and the workpiece.

5. A method according to claim 1 wherein said positioning axis of said component transporting means extends in vertical direction and said deviation between the actual position and the predetermined nominal position of the component relative to the positioning axis is measured in at least one direction within a horizontal plane.

6. A method according to claim 1 wherein said positioning axis of said component transporting means extends in vertical direction and said deviation between the actual position and the predetermined nominal position of the component relative to the positioning axis is measured in two directions, perpendicular to each other, within a horizontal plane.

7. A method according to claim 1 wherein said positioning axis of said component transporting means extends in vertical direction and said deviation between the actual position and the predetermined nominal position of the component relative to the positioning axis is measured with regard to said positioning axis.

8. An apparatus for positioning a component on a workpiece in a preset position, said apparatus comprising:

a workpiece receiving and retaining means for receiving and retaining a workpiece, storage means containing the component to be positioned onto the workpiece;

component transporting means displaceable between said storage means and said workpiece receiving and retaining means and comprising a pickup retaining member adapted to pickup and remove the component from said storage means and to retain it during transportation thereof to the workpiece, said component transporting means having a positioning axis, and the component having a predetermined nominal position relative to the positioning axis;

means for moving said component transporting means to position said positioning axis in a predetermined position relative to said workpiece receiving and retaining means;

position detection means for detecting an actual position of the component relative to the positioning axis of the component transporting means, for measuring a deviation of said actual position of the component from the predetermined nominal position thereof relative to the positioning axis, and for generating a control signal in response to a deviation of said actual position of the component relative to the positioning axis from the predetermined nominal position thereof relative to the positioning axis, said position detection means being located within the path of displacement of the component by said pickup and retaining member of said component transporting means; and control means for effecting a change in the position of the positioning axis in response to said control signal to thereby change the actual position of the component so that it coincides with the preset position thereof on the workpiece.

9. An apparatus according to claim 8 wherein said workpiece receiving and retaining means and said component pickup and retaining member are vertically spaced, and said position detection means is arranged at a certain distance above said workpiece receiving and retaining means and below said component pickup and retaining member, and being positioned essentially concentrically to said workpiece receiving and retaining means and said pickup and retaining member.

10. An apparatus according to claim 8 wherein said position detection means comprises a frame member, and said pickup and retaining member of said component transporting means is adapted to pass through the interior of said frame member.

11. An apparatus according to claim 10 wherein said frame member has essentially a rectangular shape and includes four frame side elements, at least one of said frame side elements being equipped with a position detection member.

12. An apparatus according to claim 11 wherein several of said four frame side elements are equipped with a position detection needle arranged essentially in the center of a respective frame side element and extending essentially perpendicularly thereto, and means for displacing longitudinally said position detection needles and for measuring the longitudinal displacement of said position detection needle.

13. An apparatus according to claim 12 wherein said means for displacing said position detection needle and for measuring the displacement thereof is operatively connected with said control means.

14. An apparatus according to claim 11 wherein an emitter element is provided in the region of each of two diagonally opposite corners of said frame member for emitting a beam reflectable by a component situated within the interior of said frame member, said emitter element being rotatable along a rotation angle of at least 90°, and a receiver element is provided in the region of each of the two remaining opposite corners of said frame member for receiving said beam emitted by said emitter element and reflected by said component.

15. An apparatus according to claim 14 wherein said emitter element is rotatable along a rotation angle of 360°.

16. An apparatus according to claim 14 or 15 wherein said emitter elements and said receiver elements are operatively connected to said control means.

17. An apparatus according to claim 14 wherein said emitter elements are semiconductor laser beam emitting diodes, and said receiver elements are light-sensitive semiconductor elements.

18. An apparatus according to claim 11 wherein a row of adjacent beam emitting emitter elements is provided along at least one frame side element of said frame member, and a row of adjacent receiver elements for receiving beams emitted by said emitter elements is provided along the opposite frame side element of said frame member.

19. An apparatus according to claim 18 wherein said emitter elements are semiconductor laser beam emitting diodes, said receiver elements are light-sensitive semiconductor elements, one laser diode being associated with a related light-sensitive receiver element.

20. An apparatus according to claim 11 wherein a row of adjacent light-sensitive receiver elements is provided along at least one frame side element of said frame member, and a double emitter element capable of emitting two beams in diametrally opposite directions is provided essentially in the center of the frame side element lying opposite said one frame side element with said light-sensitive receiver elements, each of the two ends of said frame side element lying opposite said one frame side element bearing a rotatable reflector element.

21. An apparatus according to claim 20 wherein said double emitter element is a double-sided semiconductor laser diode adapted to emit two laser beams running essentially parallel to said opposite side element to said reflector elements, and said reflector elements are mirrors.

22. An apparatus according to claim 20 wherein said light-sensitive receiver elements are semiconductor elements.

23. An apparatus according to claim 14, 15, 17 and 18 wherein said beam emitting elements and said beam receiving elements are operatively connected to said control means.

* * * * *